US011873604B2

(12) United States Patent
Nakamura et al.

(10) Patent No.: US 11,873,604 B2
(45) Date of Patent: Jan. 16, 2024

(54) ENVIRONMENT-RESISTIVE COATED REINFORCEMENT FIBER APPLICABLE TO FIBER-REINFORCED COMPOSITE

(71) Applicants: IHI CORPORATION, Koto-ku (JP); NATIONAL UNIVERSITY CORPORATION YOKOHAMA NATIONAL UNIVERSITY, Yokohama (JP); JAPAN FINE CERAMICS CENTER, Nagoya (JP)

(72) Inventors: Takeshi Nakamura, Tokyo (JP); Masahiro Kotani, Tokyo (JP); Ken Goto, Tokyo (JP); Akihiko Ito, Kanagawa (JP); Satoshi Kitaoka, Aichi (JP); Daisaku Yokoe, Aichi (JP); Tetsushi Matsuda, Aichi (JP)

(73) Assignees: IHI CORPORATION, Koto-ku (JP); NATIONAL UNIVERSITY CORPORATION YOKOHAMA NATIONAL UNIVERSITY, Yokohama (JP); JAPAN FINE CERAMICS CENTER, Nagoya (JP)

( * ) Notice: Subject to any disclaimer, the term of this patent is extended or adjusted under 35 U.S.C. 154(b) by 261 days.

(21) Appl. No.: 16/877,715

(22) Filed: May 19, 2020

(65) Prior Publication Data

US 2020/0277727 A1 Sep. 3, 2020

Related U.S. Application Data

(63) Continuation of application No. PCT/JP2018/043423, filed on Nov. 26, 2018.

(30) Foreign Application Priority Data

Nov. 27, 2017 (JP) .................................. 2017-226714

(51) Int. Cl.
*D06M 11/79* (2006.01)
*D06M 11/74* (2006.01)
(Continued)

(52) U.S. Cl.
CPC ....... *D06M 11/79* (2013.01); *C04B 35/62849* (2013.01); *C04B 35/62863* (2013.01); *C04B 35/80* (2013.01); *D06M 11/74* (2013.01)

(58) Field of Classification Search
CPC ........ C04B 35/62849; C04B 35/62863; C04B 35/565
See application file for complete search history.

(56) References Cited

U.S. PATENT DOCUMENTS 5,275,984 A 1/1994 Carpenter et al.
5,552,352 A 9/1996 Brun et al.
(Continued)

FOREIGN PATENT DOCUMENTS

CN 1803715 A 7/2006
JP 5-85842 A 4/1993
(Continued)

OTHER PUBLICATIONS

Boakye, "Rare-Earth Disilicates as Oxidation-Resistant Fiber Coatings for Silicon Carbide Ceramic-Matrix Composites," 2011, J. Am. Cer. Soc. 94, 1716-24. (Year: 2011).*
(Continued)

*Primary Examiner* — Robert A Vetere
(74) *Attorney, Agent, or Firm* — Oblon, McClelland, Maier & Neustadt, L.L.P.

(57) ABSTRACT

A high-temperature-steam-oxidation-resistive coated reinforcement fiber applicable to a fiber reinforced composite, is provided with: a reinforcement fiber; a coating layer covering the reinforcement fiber and including a rare-earth silicate; an exfoliative layer intervening in an interface between
(Continued)

the coating layer and the reinforcement fiber; and a supplemental coating layer covering the reinforcement fiber, the exfoliative layer and the coating layer.

8 Claims, 10 Drawing Sheets

(51) Int. Cl.
*C04B 35/80* (2006.01)
*C04B 35/628* (2006.01)

(56) References Cited

U.S. PATENT DOCUMENTS

| | | |
|---|---|---|
| 6,759,151 B1 | 7/2004 | Lee |
| 7,595,114 B2 | 9/2009 | Meschter et al. |
| 9,926,238 B2 | 3/2018 | Louchet et al. |
| 2009/0220776 A1 | 9/2009 | Meschter et al. |
| 2013/0210299 A1 | 8/2013 | Zhang et al. |
| 2013/0260130 A1 | 10/2013 | Taxacher et al. |
| 2016/0096778 A1* | 4/2016 | Chamberlain .... C04B 35/62847 427/249.2 |
| 2016/0130188 A1 | 5/2016 | Louchet et al. |
| 2016/0159694 A1 | 6/2016 | Chamberlain et al. |
| 2016/0159695 A1 | 6/2016 | Chamberlain et al. |
| 2016/0187078 A1 | 6/2016 | Yamamura et al. |
| 2017/0044069 A1 | 2/2017 | Harris |
| 2017/0217842 A1 | 8/2017 | Sato et al. |
| 2017/0240474 A1 | 8/2017 | Lazur |
| 2018/0044249 A1 | 2/2018 | Taillet et al. |

FOREIGN PATENT DOCUMENTS

| | | |
|---|---|---|
| JP | 5-170538 A | 7/1993 |
| JP | 2914386 B2 | 6/1999 |
| JP | 2006-143553 A | 6/2006 |
| JP | 2013-164066 A | 8/2013 |
| JP | 2015-203129 A | 11/2015 |
| RU | 2 435 673 C2 | 12/2011 |
| RU | 2 656 638 C2 | 6/2018 |
| RU | 2 696 955 C2 | 8/2019 |
| WO | WO 2016/132821 A1 | 8/2016 |

OTHER PUBLICATIONS

International Search Report dated Feb. 26, 2019 in PCT/JP2018/043423 filed on Nov. 26, 2018, 2 pages.
Combine Russian Office Action and Search Report dated Jan. 14, 2021 in corresponding Russian Patent Application No. 2020120680 (with English Translation), 18 pages.
Extended European Search Report dated Jul. 8, 2021 in European Patent Application No. 18880668.1, 8 pages.
Boakye, E.E., et al., "Rare-Earth Disilicates as Oxidation-Resistant Fiber Coatings for Silicon Carbide Ceramic-Matrix Composites", J. Am. Ceram. Soc., vol. 94, No. 6, 2011, pp. 1716-1724.
Combined Chinese Office Action and Search Report dated May 10, 2022 in Chinese Patent Application No. 201880076068.4 (with English Translation of Categories of Cited Documents), 7 pages.

* cited by examiner

ENVIRONMENT-RESISTIVE COATED REINFORCEMENT FIBER APPLICABLE TO FIBER-REINFORCED COMPOSITE

CROSS-REFERENCE TO RELATED APPLICATIONS

This application is a Continuation Application of PCT International Application No. PCT/JP2018/043423 (filed Nov. 26, 2018), which is in turn based upon and claims the benefit of priority from Japanese Patent Application No. 2017-226714 (filed Nov. 27, 2017), the entire contents of which are incorporated herein by reference.

BACKGROUND

Technical Field

The disclosure herein relates to an environment-resistive reinforcement fiber applicable to a fiber-reinforced composite, and in particular to a coated reinforcement fiber in which a coating consisting of a substance such as a rare-earth silicate intervenes between the reinforcement fiber and a matrix, where a member such as a turbine rotor or stator made of the fiber-reinforced composite is used in severely oxidizing environments.

Background Art

A turbine in an airplane is to have contact with hot gas in association with compression of sucked air and combustion of fuel and this air contains a non-negligible amount of water vapor. The turbine is thus exposed to severely oxidizing environments. Although nickel-based superalloys have been used as heat-resistant materials so far, in light of further weight reduction and heat resistance improvement, application of ceramic matrix composites (CMC) is currently under intense study widely. CMC is a composite in which a fabric of silicon carbide (SiC) fibers is combined with a matrix of SiC (SiC/SiC) for example. In addition, a variety of combinations such as C/C, C/SiC, $SiC/Si_3N_4$, $Al_2O_3/Al_2O_3$ and others would be possible.

SiC fibers are, regardless of its very high strength, relatively vulnerable to crack propagation. To prevent propagation of cracks from the matrix to the fibers and thereby improve its toughness, an art to coat the fibers with boron nitride (BN) in advance is disclosed. Related arts are disclosed in International Publication WO 2016/132821 A1 and Japanese Patent Application Laid-open No. 2015-203129.

SUMMARY

BN is, regardless of its high heat resistance, relatively susceptible to steam oxidation. Therefore application thereof to turbine rotors or stators requires some supplemental measures to protect the coating from steam oxidation. This field potentially has a need for a reinforcement fiber with a coating effectively preventive against crack propagation from the matrix to the reinforcement fiber and as well of itself resistive to steam oxidation.

According to an aspect, a high-temperature-steam-oxidation-resistive coated reinforcement fiber applicable to a fiber reinforced composite, is provided with a reinforcement fiber, a coating layer covering the reinforcement fiber and including a rare-earth silicate, an exfoliative layer intervening in an interface between the coating layer and the reinforcement fiber, and a supplemental coating layer covering the reinforcement fiber, the exfoliative layer and the coating layer.

ADVANTAGEOUS EFFECTS

The coating layer prevents propagation of cracks starting from the matrix, and as well the exfoliative layer prevents the cracks from going toward the reinforcement fiber, thereby improving the strength of the fiber-reinforced composite.

DESCRIPTION OF EMBODIMENTS

Figure 1:
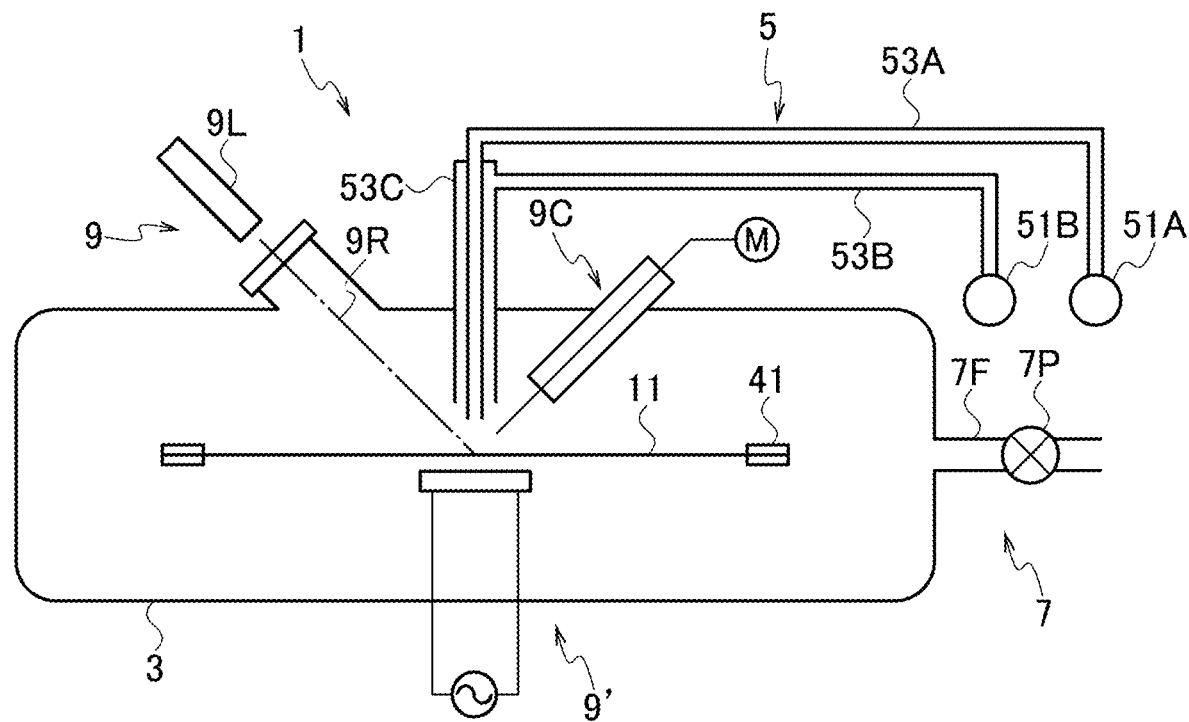
FIG. 1 is a schematic drawing of an apparatus for coating a reinforcement fiber with an environment-resistive coating.

Exemplary embodiments will be described hereinafter with reference to the appended drawings.

A reinforcement fiber applicable to a fiber-reinforced ceramic, as described already, includes or consists of SiC for example, but instead or additionally applicable is a ceramic such as carbon (C), silicon nitride ($Si_3N_4$) or alumina ($Al_2O_3$). A fiber in which several hundreds or thousands of filaments of from 5 to 15 micrometers each in diameter are bundled can be used as the reinforcement fiber, although not limited thereto. What is applicable as such a reinforcement fiber is any commercially available fiber of SiC, in particular any fiber available in the name of "Tyranno Fiber" (UBE Industries, Ltd.) or "Hi-Nicalon" (NGS Advanced Fiber Co., Ltd.) for example.

This reinforcement fiber is coated with an environment-resistive coating. Rare-earth silicates such as those represented by a chemical formula $Re_2Si_2O_7$ or $Re_2SiO_5$ (Re is an arbitrary rare-earth element) are highly resistive to oxidation under steam oxidation atmospheres and are, even if oxidized, unlikely to form low-melting-point products. Further, the rare-earth silicates can form strong bonds with ceramics such as SiC. The environment-resistive coating therefore, at least in its coating layer exposed on its surface, preferably includes or consists of any rare-earth silicate. Among the rare-earth silicates, ytterbium silicate is preferably applicable in light of resistance to steam oxidation.

The aforementioned environment-resistive coating further includes an exfoliative layer that weakens the bond with the reinforcement fiber. Studies by the present inventors have revealed that, if the rare-earth silicate formed a strong bond with the reinforcement fiber, the strong bond could rather spoil the strength of the reinforcement fiber. It is inferred that, in a case where applied stress produces cracks in the matrix or in the environment-resistive coating, the cracks are likely to propagate through the environment-resistive coating to the reinforcement fiber and this likelihood of crack propagation can cause the aforementioned strength reduction. The exfoliative layer, by weakening the bond with the reinforcement fiber, stops the propagation of the cracks in the exfoliative layer or directs their propagation along the exfoliative layer, thereby protecting the reinforcement fiber. The reinforcement fiber can thus achieve its inherent strength, thereby contributing improvement of the strength of the fiber-reinforced composite.

The exfoliative layer is formed on, or in direct contact with, the reinforcement fiber and may be accordingly laid below the coating layer. In this case, the exfoliative layer may intervenes in an interface between the coating layer and the reinforcement fiber. In place or in addition, the exfoliative layer may be laid above the coating layer.

The exfoliative layer may be formed of a material distinct from the coating layer. Where one of them is of $Re_2Si_2O_7$ and another is of $Re_2SiO_5$ for example, this combination can promote exfoliation therebetween. Or, they may be of materially identical but allotropically distinctive substances. Since $Re_2Si_2O_7$ for example is polymorphous, one may be of one of polymorphs and another may be of another. Or, the exfoliative layer may be either materially identical or distinctive from the coating layer but may include defects such as a large number of pores or holes, or may be of the identical material to that of the coating layer but may further include another material. For example, although the coating layer includes only one of the polymorphs, the exfoliative layer may include two or more of the polymorphs. Still further, any combination of thereof is applicable thereto.

While the environment-resistive coating can be formed by any publicly-known method such as a vapor phase method or a dip method, a thermal CVD method may be applied. An exemplary process by the thermal CVD method will be described hereinafter with reference to FIG. 1.

A CVD apparatus 1 is in general provided with a chamber 3 as a reaction vessel, a gas feed device 5 for feeding reaction gases, an exhaust device 7 for expelling exhaust, and a heater device 9 for heating the reaction gases. A reinforcement fiber 11 is supported by a support 41 within the chamber 3 and is thereby exposed to reaction.

To the chamber 3 available is a cold wall chamber that is capable of controlling an atmosphere therein. The chamber is so structured as to gas-tightly close itself, but is connected to the gas feed device 5 and the exhaust device 7, thereby being evacuated down to a reduced pressure. Valve or mass flow controllers for regulating feeding rates of the gases may be provided on the gas feed device 5, and a flow regulating valve may be on the exhaust device 7 as well. Balance between the feeding rates of the gases by the gas feed device 5 and the exhaust rate by the exhaust device 7 enables arbitrary regulation of internal pressure. Pressures around from 200 through 2000 Pa for example may be applied to the pressure under reaction.

The chamber 3 is drawn in FIG. 1 to be elongated in the horizontal direction. While this shape is advantageous to reception of the longitudinally long reinforcement fiber 11 in the horizontal direction, the shape is of course arbitrarily determined. The chamber 3 may be for example elongated in the vertical direction and then the reinforcement fiber 11 may be vertically hang down.

The gas feed device 5 is provided with two or more sets of gas feed sources and supply paths in combination, which are respectively capable of supplying gases to the chamber 3. Although FIG. 1 depicts only two sets of gas feed sources 51A, 51B and supply paths 53A, 53B, this is no more than an example and three or more sets are applicable. One gas feed source 51A may, for example, be provided with a carrier gas cylinder and an ingredient heater furnace, and the ingredient is heated in the ingredient heater furnace and thereby made to volatilize and is, along with carrier gas, supplied to the supply path 53A. The other gas feed source 51B can be provided with a cylinder for supplying another gas.

The two or more supply paths 53A, 53B gas-tightly intrude into the chamber 3 and tip ends thereof are opened toward a reaction point. The two or more supply paths 53A, 53B may form a coaxial tube 53C in which these paths are coaxially superimposed. This structure is advantageous to prevention of mixture and reaction among gases in advance before the reaction point.

The exhaust device 7 is provided with a flow path 7F gas-tightly connected to the chamber 3 and a vacuum pump 7P gas-tightly connected to the flow path 7F, which evacuate the interior of the chamber 3 and reduce pressure therein as well.

The heater device 9 heats the reinforcement fiber 11 to cause reactions on its surface. In order to limit an area where reactions occur, a means for locally and remotely giving heat is applicable to the heater device 9 and its example is a laser device 9L. To the laser device 9L applicable is any publicly-known laser such as a semiconductor laser, a YAG laser or a carbon dioxide laser, although this is not limiting to the embodiment. The laser device 9L may be installed outside the chamber 3, which irradiates and heats the reinforcement fiber 11 with a laser beam 9R through a window that the chamber 3 has.

In place of, or in addition to, the laser device 9L, a heating means by radiation or heat transfer such as a carbon heater 9' is applicable. Or, if possible, Joule heat by electric current directly through the reinforcement fiber 11 or induced current thereon may be used.

To measure its temperature, the heating device 9 may be provided with a temperature detector 9C such as a thermocouple or a pyrometer, and may be subject to feed-back control in response to the result of measurement.

Figure 2A:
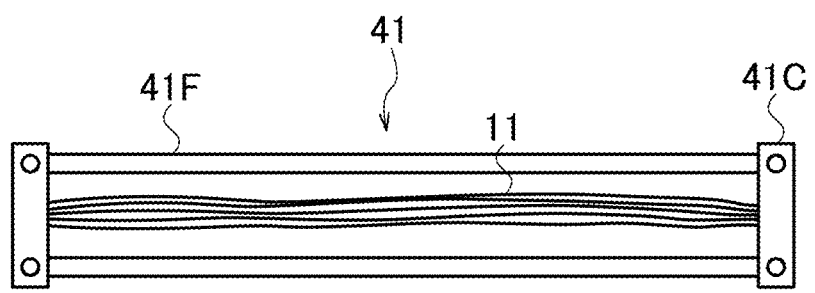
FIG. 2A is a plan view schematically showing the reinforcement fiber and a support.

The support 41 may be, as shown in FIG. 2A, a rectangular frame 41F of a metal for example. The frame 41F may be, on both ends in its longitudinal direction, provided with cramps 41C and both ends of the reinforcement fiber 11 are respectively pinched and supported by the cramps 41C. The reinforcement fiber 11 may be slightly loosened in order to avoid ill effects by expansion and contraction originated from heating and cooling. The support 41 may not be secured to the chamber 3 and may be so constituted as to gradually move as the reaction continues. Alternatively, the support 41 may be immovable and instead the heating device 9 may be made movable in order to gradually move the reaction point. These measures permit coating formation over a long range.

Figure 2B:
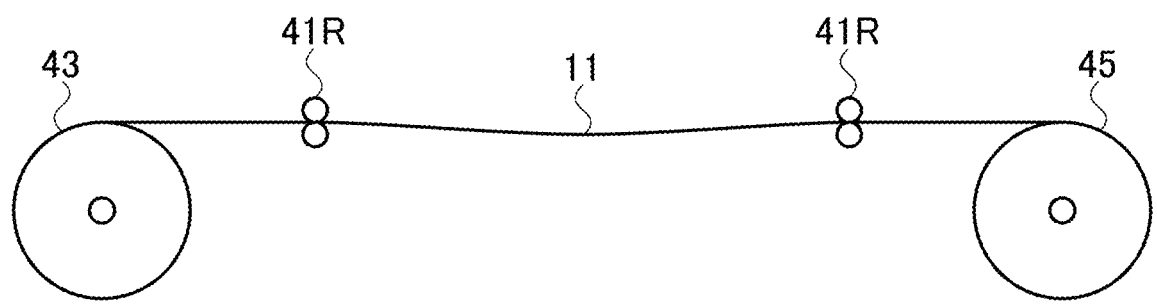
FIG. 2B is an elevational view schematically showing the reinforcement fiber and a support.

The support 41 may be alternatively, as shown in FIG. 2B, two pairs of pinch rollers 41R. The reinforcement fiber 11 is pinched and supported by the respective pairs of pinch rollers 41R. As with the description above, the reinforcement fiber 11 may be slightly loosened between two pairs of the pinch rollers 41R. The reinforcement fiber 11 may be made to run from one pair of the pinch rollers 41R toward the other pair as the reaction continues. This is advantageous to formation of a coating over a long range in particular. Further in this case, the reinforcement fiber 11 may be fed from a feeder 43 and the fiber after reaction may be wounded by a winder 45. The feeder 43 and the winder 45 may be installed in or outside the chamber 3. This is advantageous to formation of a coating over a long range beyond the dimensions of the chamber 3.

Next, a method for coating the reinforcement fiber with the environment-resistive coating will be described hereinafter with reference to FIGS. 3A and 3B in combination with FIG. 1. While formation of the environment-resistive coating of ytterbium silicate will be exemplified therein, formation of another rare-earth silicate would not cause any substantial differences except a difference of ingredients. Further, although a case where the exfoliative layer is laid in the lower layer and the coating layer is in the upper layer will be exemplified hereafter, reversal of these layers would not cause any substantial differences as a possible difference is no more than that about conditions required in the first and second heating.

The ingredients for ytterbium silicate are, for example, tris-(dipivaloyl-methanato)-ytterbium (chemical formula: $Yb(dpm)_3$) and tetraoxysilane (chemical formula: $Si(OC_2H_5)_4$, abbreviated as "TEOS"). In the subsequent description, they are simply referred to as "ingredients".

The reinforcement fiber 11 is supported by the support 41 and introduced into the chamber 3. The chamber 3 is gas-tightly closed and is, normally prior to reaction, evacuated for a proper duration of time. This is advantageous to reduction of impurities. The evacuation is normally executed by operation of the exhaust device 7 with closing the gas feed sources 51A and 51B.

The ingredients are, as being liquid at a normal temperature, vaporized in ingredient heating furnaces. Based on the mixing ratio of $Yb(dpm)_3$ in the vapor of the ingredients, the Yb molar fraction could be regulated. The Yb molar fraction is for example from 0 through 100 mol %. Higher Yb molar fractions are preferable if amorphous components in the coating are tried to be reduced, and the fraction is 5 mol % or more for example. Still higher Yb molar fractions are preferable if $\beta$-$Yb_2Si_2O_7$ contained in the coating is tried to be reduced, and the fraction is 50 mol % or more for example. Further, lower Yb molar fractions are preferable if ytterbium oxides contained in the coating are tried to be reduced, and the fraction is 95 mol % or less for example. Further, still lower Yb molar fractions are preferable if $Yb_2SiO_5$ contained in the coating is tried to be reduced, and the fraction is 80 mol % or less for example.

By opening the gas feed source 51A, the aforementioned mixed vapor is, along with a carrier gas such as argon, fed through the supply path 53A to the chamber 3. In addition, by opening the gas feed source 51B, oxygen is fed through the supply path 53B to the chamber 3. Based on balance between the supplying rate and the exhaust rate, the internal pressure in the chamber 3 can be regulated. The pressure is from 200 through 2000 Pa for example. (FIRST ATMOSPHERE)

By operating the heater device 9, the temperature of the reinforcement fiber 11 at the reaction point is raised. The temperature is measured by means of the temperature detector 9C and is, by regulating output by the heater device 9, controlled to be a temperature T1 in a range from 500 through 900 degrees C. for example and kept for a duration of time t1 in a range from 3 through 15 minutes (FIRST HEATING). It may be subject to feed-back control over the heater device 9 in response to the measurement by the temperature detector 90.

With continuing heating, the reaction point may be gradually moved by either moving the reinforcement fiber 11 or moving the heater device 9. In this case, the moving speed is so determined that heating is maintained for the time t1 in accordance with the dimensions of the area to be heated.

Figure 3A:
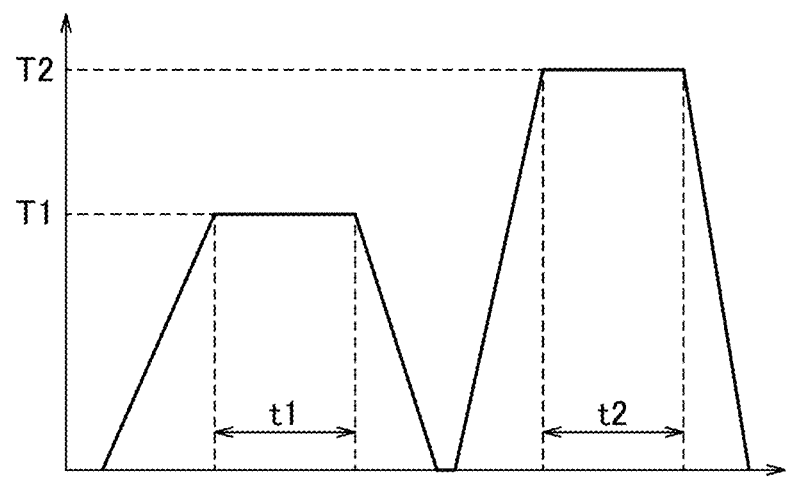
FIG. 3A is a graph schematically illustrating a heating condition in accordance with an example.
Figure 3B:
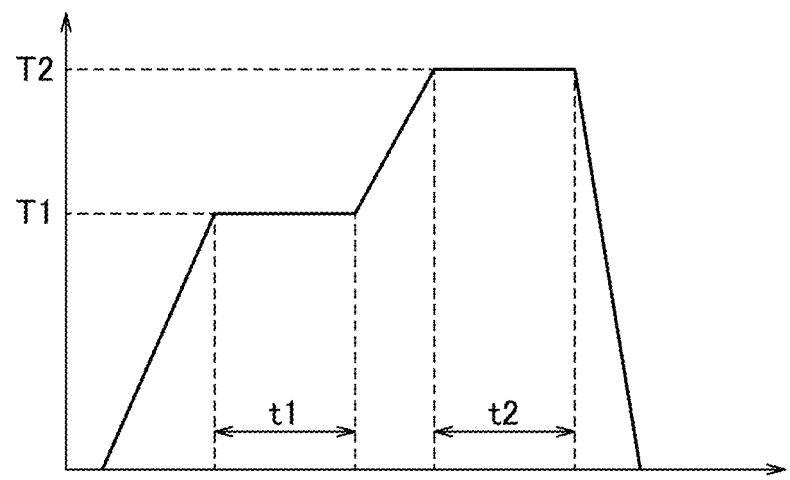
FIG. 3B is a graph schematically illustrating a heating condition in accordance with another example.

After finishing the first heating, as shown in FIG. 3A, a proper time may be taken for cooling the reinforcement fiber down to a normal temperature. In this case, the reinforcement fiber 11 may be once taken out of the chamber 3, and second heating as described next will be executed in another chamber. Notwithstanding, as shown in FIG. 3B, the second heating may be executed in series with the first heating. In this case, the second heating may be executed in the identical chamber.

The first heating results in formation of a coating of ytterbium silicate on the reinforcement fiber 11, from which an exfoliative layer 15 described later originates.

After or without evacuating the chamber 3 again, by opening the gas feed sources 51A, 51B and with properly regulating the Yb molar fraction, the ingredient gases of $Yb(dpm)_3$ and TEOS along with oxygen are fed to the chamber 3. By regulating the pressure in the chamber 3 on the basis of balance between the supply flow rate and the exhaust rate, the pressure is regulated to be in a range from 200 through 2000 Pa for example. This second atmosphere may be either identical to or distinct from the aforementioned first atmosphere. By changing the Yb molar fraction or the pressure for example, the resultant coating can be made denser.

After regulating the atmosphere, the heater device 9 is operated to heat the reinforcement fiber 11 at the reaction point and the temperature is regulated to be the temperature T2 in the range from 500 through 900 degrees C. for example and kept for the time t2 in the range from 3 through 15 minutes for example (SECOND HEATING). Feedback control is, as described already, applicable. The temperature T2 may be either identical to or distinct from the temperature T1 described above. By raising the temperature T2 as compared with the temperature T1 for example, the coating can be made denser.

The coating by the first heating, as heated or by transforming by the second heating, constitutes the exfoliative layer 15. On this exfoliative layer 15, another ytterbium silicate layer is formed by the second heating and is a coating layer 17 described later.

After the second heating, similar steps may be further executed to form still another coating on the coating layer 17. Alternatively, a process distinct from the aforementioned process, such as a dipping method or such for example, may be applied in order to form a supplemental coating.

For the supplemental coating, any substance that thermodynamically stabilizes the coating layer 17 and the exfoliative layer 15 may be selected. In a case where the coating layer 17 and the exfoliative layer 15 are both formed of any rare-earth silicate, in particular of ytterbium silicate for example, the supplemental coating may include silicon carbide which thermally stabilizes the silicate. Without such a stabilizing substance, any rare-earth silicate, particularly ytterbium silicate $Yb_2Si_2O_7$, when heated, would decompose into $Yb_2SiO_5$ and subsequently into $Yb_2O_3$. Coexistence with silicon carbide causes ytterbium silicate to thermodynamically stabilize more and the decomposition reaction is thus suppressed. Specifically, the supplemental coating including, or consisting of, silicon carbide improves environment resistance of the coating layer 17 and the exfoliative layer 15.

To form the supplemental coating, after or without evacuating the chamber 3, any vaporized ingredient such as polycarbosilane is, along with argon as a carrier, fed to the chamber 3. The ingredient is not limited to polycarbosilane and instead methyl trichlorosilane or any proper gas is applicable. By regulating the pressure in the chamber 3 on the basis of balance between the supply flow rate and the exhaust rate, the pressure is regulated to be in a range from 200 through 2000 Pa for example, and the temperature of the reinforcement fiber 11 at the reaction point is raised by operation of the heater device 9. The temperature is measured by means of the temperature detector 9C and is, by regulating output by the heater device 9, controlled to be a temperature in a range from 1000 through 1200 degrees C. for example and kept for a duration of time in a range from 3 through 15 minutes (THIRD HEATING). Feed-back control over the heater device 9 may be achieved in response to the measurement by the temperature detector 9C.

Figure 4:
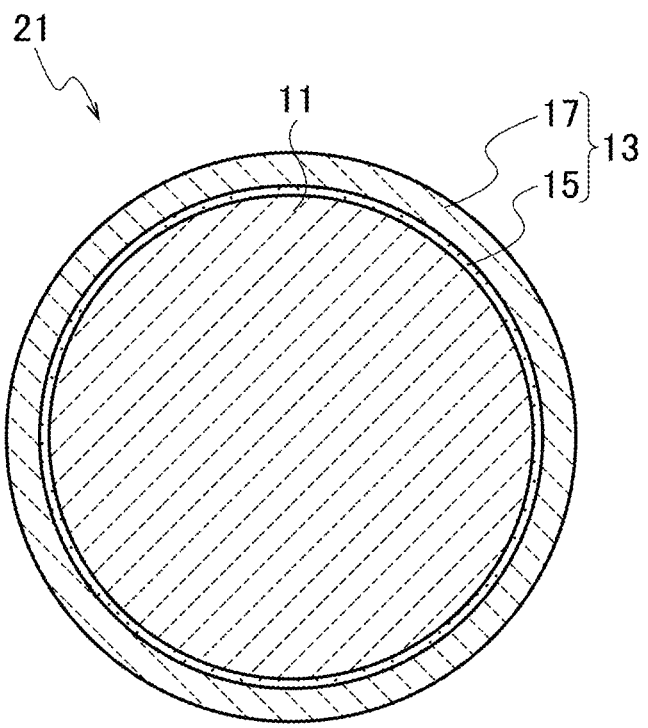
FIG. 4 is a schematic cross-sectional view of a coated fiber.

After finishing the heating, a proper time is taken for cooling the coated fiber 21 down to a normal temperature and the fiber is taken out of the chamber 3. Referring to FIG. 4, the coated fiber 21 is coated with the coating 13, which mainly consists of the exfoliative layer 15 and the coating layer 17. While the lower layer is the exfoliative layer 15 and the upper layer is the coating layer 17 presumably, it does not mean that one can necessarily observe a clear boundary between two layers in a microscope as shown in the drawing. Contradictory to the explanation, the exfoliative layer 15 may be made upper and the coating layer 17 lower. The supplemental coating comes into being further over these layers and along therewith covers the reinforcement fiber.

The coating layer 17 protects the reinforcement fiber 11 from the environment and as well prevents cracks formed in the matrix from reaching the reinforcement fiber 11. The exfoliative layer 17 weakens bonding between the coating layer 17 and the reinforcement fiber 11 (or the matrix) to further prevent cracks that have reached the coating layer 17 from reaching the reinforcement fiber 11, or develop the cracks along the exfoliative layer 15 to deflect the courses of the cracks away from the reinforcement fiber 11. As the reinforcement fiber 11 without suffering cracks can achieve its inherent strength, the structure improves the strength of the fiber reinforced composite.

To test the effects by the present embodiment, tensile tests were carried out in regard to fiber reinforced composites in which reinforcement fibers coated with environment-resistive coatings are combined with matrices of phenolic plastic.

TABLE 1 relation between coating conditions and strengths of composites

| test piece | molar fraction (mol %) | coating temperature (degrees C.) first heating | coating temperature (degrees C.) second heating | exfoliation ratio | strength ratio (%) |
|---|---|---|---|---|---|
| a | 50 | 650 | — | 0 | |
| b | 50 | 900 | — | 0.1 | 46 |
|   |    |     |     | 0.1 | 56 |
|   |    |     |     | 0 1 | 60 |
| c | 50 | 650 | 900 | 0.4 | 118 |
|   |    |     |     | 0.4 | 84 |
|   |    |     |     | 0.4 | 76 |
| d | 60 | 650 | 900 | 0.34 | 116 |
|   |    |     |     | 0.34 | 98 |
|   |    |     |     | 0.34 | 80 |
| e | 70 | 650 | 900 | 0.3 | 102 |
|   |    |     |     | 0.3 | 96 |
|   |    |     |     | 0.3 | 94 |
| f | 80 | 650 | 900 | 0.3 | 92 |
|   |    |     |     | 0.3 | 76 |

The reinforcement fibers are those commercially available under the name of Tyranno Fiber SA grade, in which 1600 filaments of SiC each 7.5 micrometers in diameter are bundled. They were subject to six different kinds of coating conditions listed in Table 1 to respectively form coatings thereon. Yb molar fractions were 50 mol % (test pieces a-c), 60 mol % (test piece d), 70 mol % (test piece e) and 80 mol % (test piece f), the first heating was executed at 650 degrees C., and the second heating was executed at 900 degrees C. As to the test piece a, however, coating formation was only once carried out at 650 degrees C. Specifically the coating thereon includes only one layer. As to the test piece b, similarly only one layer by heating at 900 degrees C. is formed.

Figure 5:
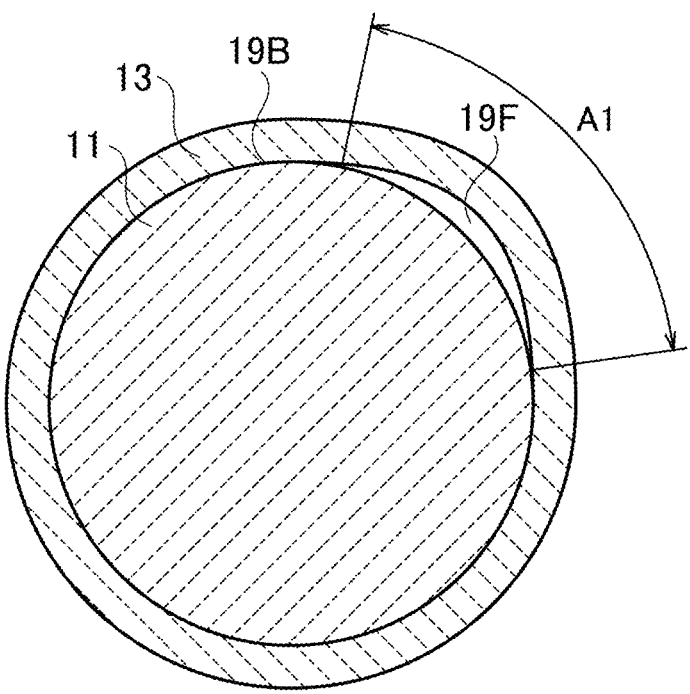
FIG. 5 is a schematic cross-sectional view of the coated fiber from which the coating partly exfoliates.

The respective test pieces were embedded in resin and polished, and were subject to cross-sectional observation. The cross-section, typically as shown in FIG. 5, presents an interface 19B where the reinforcement fiber 11 seems to adhere to the coating 13 and an exfoliating face 19F where it exfoliates. By executing image analysis on the observed cross-sections to discriminate them from each other, exfoliation ratios were measured, where an exfoliation ratio is a ratio of a length A1 of an exfoliating face 19F to a perimeter A0 of a reinforcement fiber. Results are placed on the second right column of Table 1.

Figure 6:
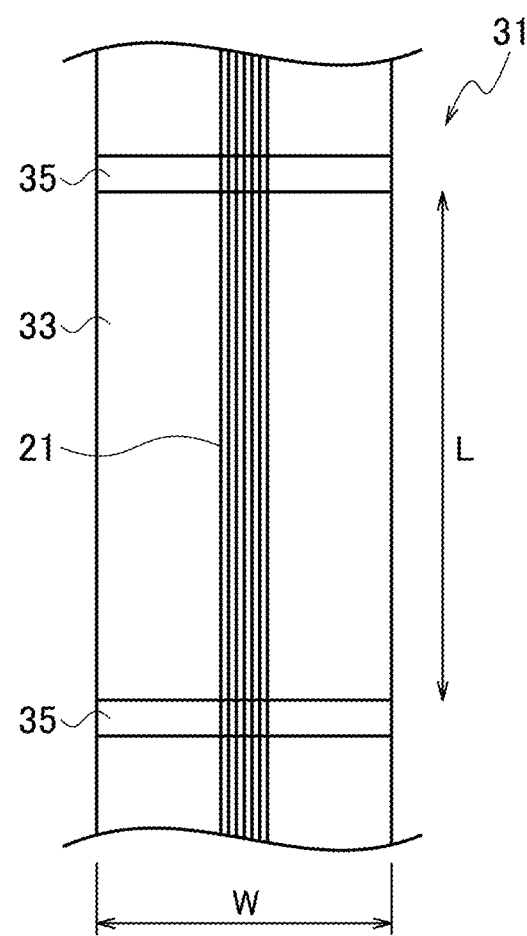
FIG. 6 is a plan view of a test piece to be served for a strand tensile test.

On the other hand, the test pieces b-f were respectively embedded in matrices 33 in a band-like shape consisting of phenolic plastic to form composites 31 as shown in FIG. 6 and a pair of targets 35 for optical observation were added to each test piece. The resultant test pieces have a width W of 20 mm and a total length of 100 mm, while a test piece length L between the pair of targets 35 is 30 mm. The totality thereof was adhered to a tab being 40 mm in width and was, along with the tab, set in a tensile test device to carry out tensile tests. Displacement between the pair of targets 35 can be measured by continuously recording the tensile tests on video and carrying out image analysis on the recorded video images. Strength ratios were calculated as a ratio of a tensile strength of a composite to a tensile strength of a corresponding reinforcement fiber of itself. Results are placed on the right end column of Table 1.

As being apparent from Table 1, the test pieces (c-f) each having a coating of two layers have prominently higher exfoliation ratios than those (a, b) each having a single layer.

It is thus apparent that the exfoliative layers weaken bonds in the coatings. On the other hand, the test pieces (c-f) including the exfoliative layers have prominently higher strength ratios than that of the test piece (b) with a single layer. It is thus apparent that the exfoliative layers create beneficial effects in improving strength of the reinforcement fibers.

In regard to simulated CMCs where reinforcement fibers are combined with matrices of silicon carbide, tensile tests were carried out in order to test the effect that the reinforcement fiber reinforces the ceramic matrix in accordance with the present embodiment.

The reinforcement fibers are those commercially available under the name of Tyranno Fiber SA grade, in which 1600 filaments of SiC each 7.5 micrometers in diameter are bundled. A furnace was kept at 800 Pa, ingredient gases with a Yb molar fraction of 57 mol % were fed thereto, 10 minute coating formation at 850 degrees C. was executed by heating the fiber by means of the semiconductor laser device 9L with 1470 nm in wavelength, 5 minute coating formation at 1100 degrees C. was further executed by feeding ingredient gases with a Yb molar fraction of 44 mol % thereto, and further a supplemental coating was added by feeding polycarbosilane and heating it at 1150 degrees C. for 5 minutes. Specifically, in the example, the coated reinforcement fiber consists of the reinforcement fiber, a ytterbium silicate layer (an exfoliative layer and a coating layer) and a silicon carbide layer covering them (a supplemental coating layer). The silicon carbide layer covers the ytterbium silicate layer without any substantial gap. By a publicly-known PIP method, the reinforcement fiber is covered with a matrix of silicon carbide to form a simulated CMC (a working example E).

As a comparative example, a BN coating was formed on an identical reinforcement fiber by means of the publicly-known method and the fiber was combined with a matrix of silicon carbide similarly to produce a simulated CMC (a comparative example C), which was subject to the test.

Figure 7:
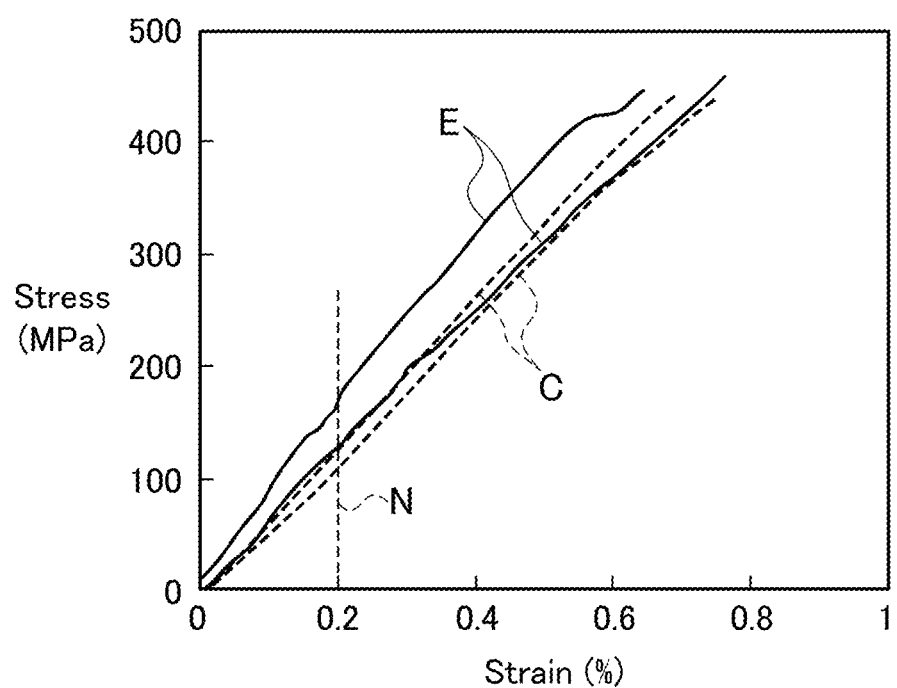
FIG. 7 is a graph illustrating tensile test results of simulated fiber reinforced composites.

FIG. 7 shows results gained by measurement of stress-strain curves about the comparative example C and the working example E. In the stress-strain curves, there's no apparent difference between the working example E and the comparative example C and the tensile strengths (stresses) are both over 400 MPa and comparable to each other. Silicon carbide as a simple body, which does not contain a reinforcement fiber, would produce a fracture when its strain reached a broken line N shown in the drawing. It is therefore apparent that the reinforcement fiber reinforces the ceramic matrix.

Fracture surfaces after the tensile tests show traces where reinforcement fibers were drawn out. Such observation implies that the fractures had started from between the reinforcement fiber and the matrix, or more particularly from the coating layer. It is therefore expected that the present embodiment can prevent cracks created at the matrix from reaching the reinforcement fiber.

Interface shear strengths were measured on the same test pieces by means of a publicly-known fiber punching method. The comparative example with the BN coating exhibited an interface shear strength of 31.3±6 MPa and the working example with the coating of ytterbium silicate 28.5±13 MPa. Specifically, it can be expected that the effects of preventing cracks from the matrix to the fiber are not prominently different between ytterbium silicate and BN.

Figure 8:
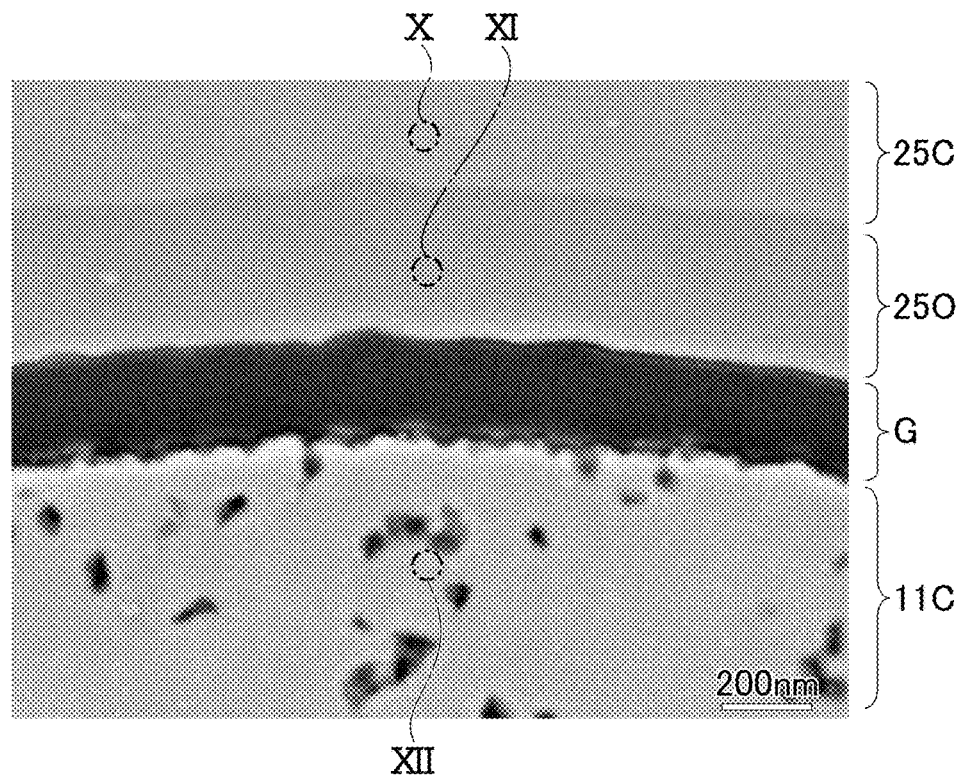
FIG. 8 is a scanning electron micrograph on a cross-section of a simulated fiber reinforced composite after an oxidation test by superheated steam in accordance with a comparable example.

To test oxidation resistance, heating tests by superheated steam were carried out. The simulated CMCs in accordance with the working example and the comparative example were kept in superheated steam at 800 degrees C. for 40 minutes, thereafter cut, embedded in resin and polished, and subject to cross-sectional observation with a scanning electron microscope. FIG. 8 shows a photograph of a cross section of the comparative example (BN coated) and FIG. 9 shows a photograph of a cross section of the working example (with a supplemental coating of ytterbium silicate and silicon carbide).

Figure 10:
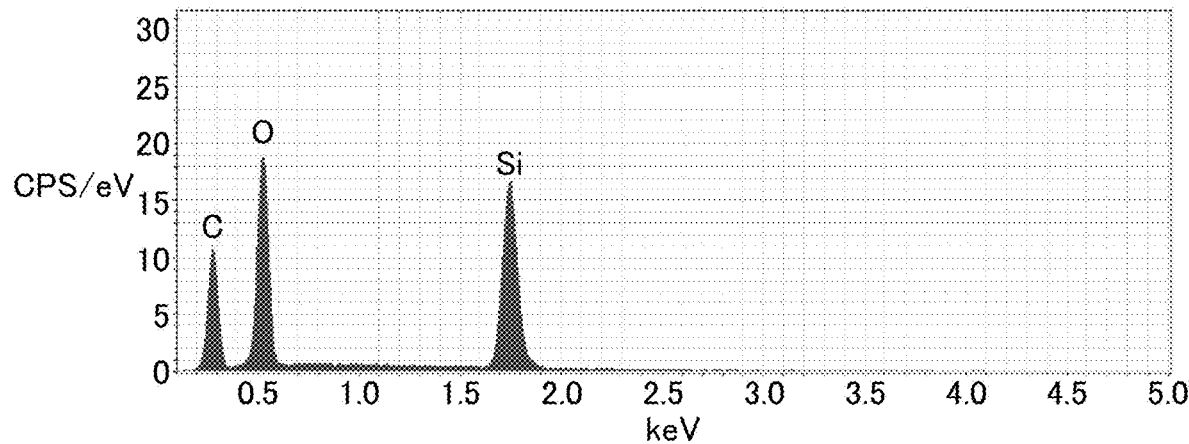
FIG. 10 is a graph showing an X-ray electronic spectroscopic spectrum measured at an area X in FIG. 8.
Figure 11:
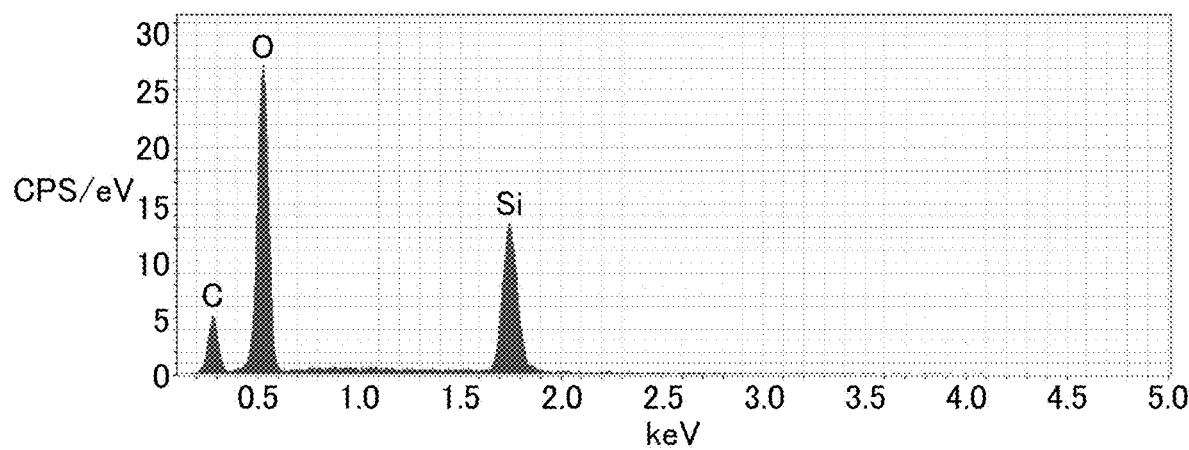
FIG. 11 is a graph showing an X-ray electronic spectroscopic spectrum measured at an area XI in FIG. 8.
Figure 12:
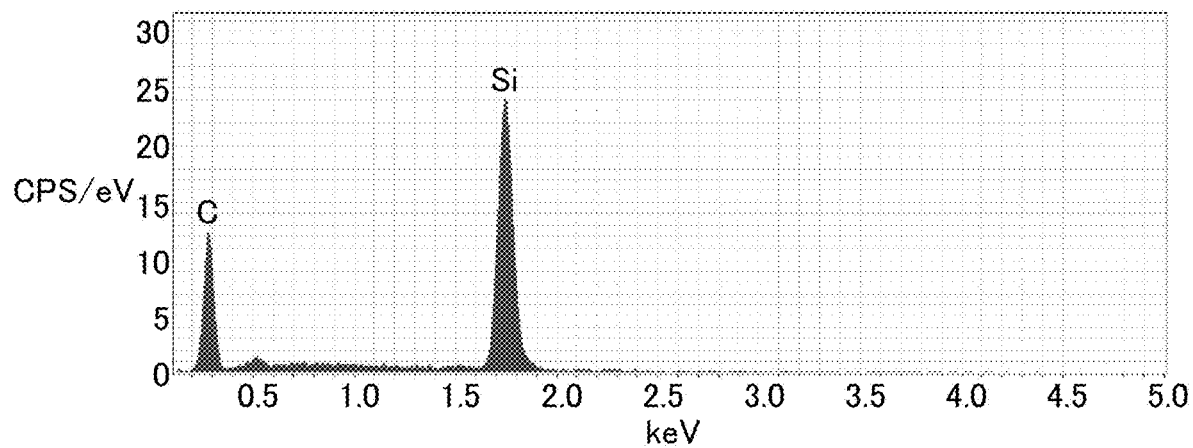
FIG. 12 is a graph showing an X-ray electronic spectroscopic spectrum measured at an area XII in FIG. 8.

In the comparative example shown in FIG. 8, the BN layer supposed to be observed just above the reinforcement fiber 11C is not observed, but instead a gap G is observed and a layer 250 in sharp contrast thereto is observed inside the matrix 25C. A spectrum by X-ray photoemission spectroscopy on an area X in the matrix 25C contains, besides carbon- and silicon-derived peaks, an oxygen-derived peak as shown in FIG. 10. On the other hand, in a spectrum on an area XI in the layer 250, the oxygen-derived peak is heightened as shown in FIG. 11. In a spectrum on an area XII, substantially only the silicon- and carbon-derived peaks are observed as shown in FIG. 12. It is considered that the layer 250 is a result of oxidation of the matrix and the BN layer is oxidized and eliminated by the superheated steam.

Figure 9:
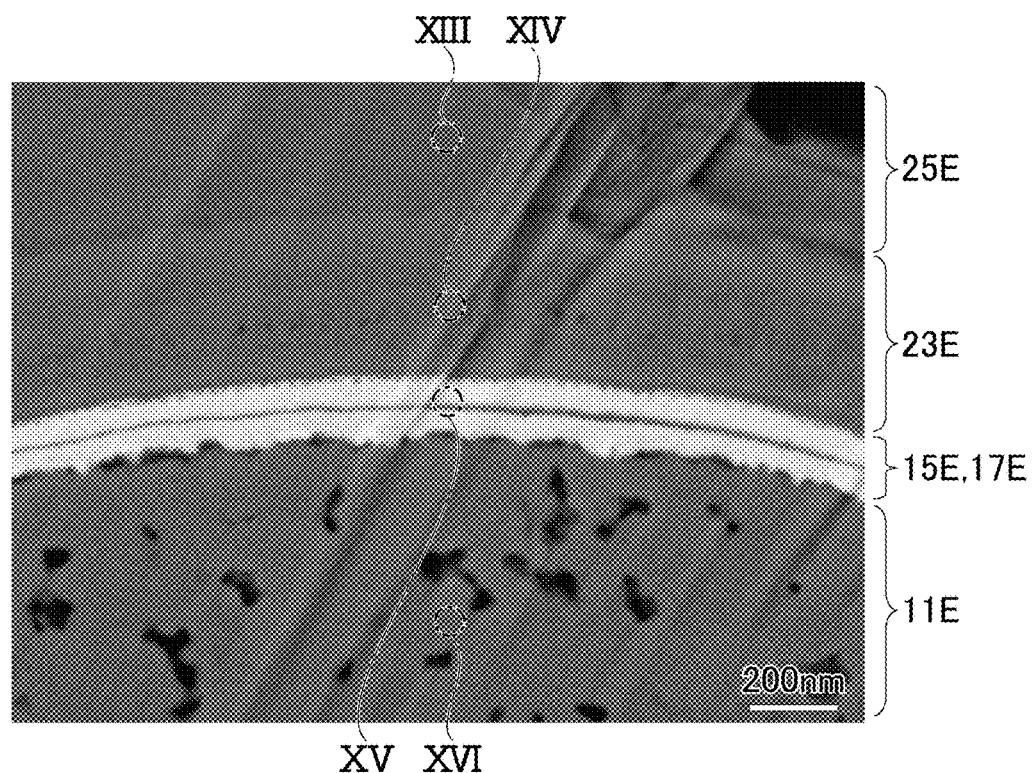
FIG. 9 is a scanning electron micrograph on a cross-section of a simulated fiber reinforced composite after an oxidation test by superheated steam in accordance with the present embodiment.

In the working example shown in FIG. 9 observed are layers 15E, 17E on a reinforcement fiber 11E, respectively considered as the coating layer and the exfoliative layer, and layers 23E, 25E thereon that mildly contrast to the former layers. Unlike the comparative example, there's no gap and these layers closely adhere to each other.

Figure 13:
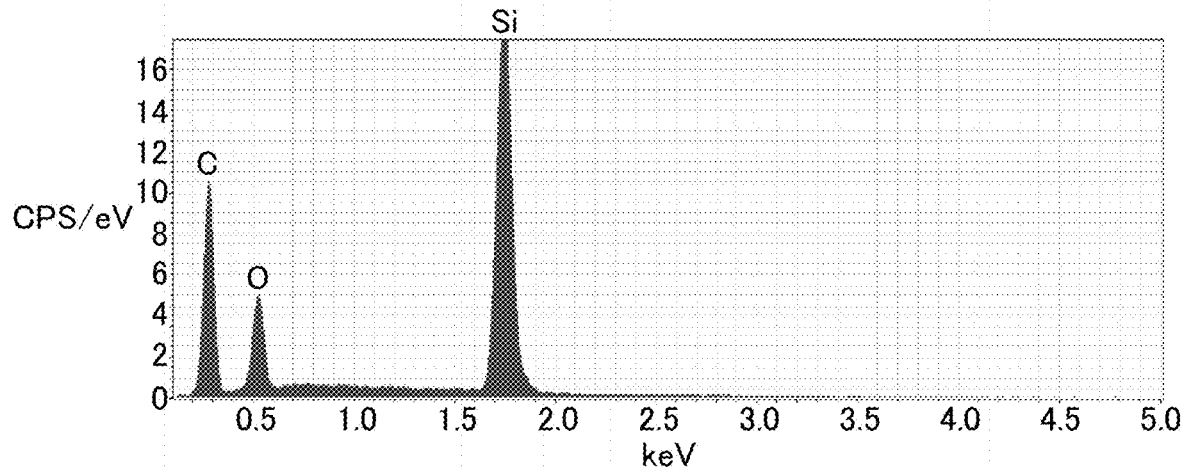
FIG. 13 is a graph showing an X-ray electronic spectroscopic spectrum measured at an area XIII in FIG. 9.
Figure 14:
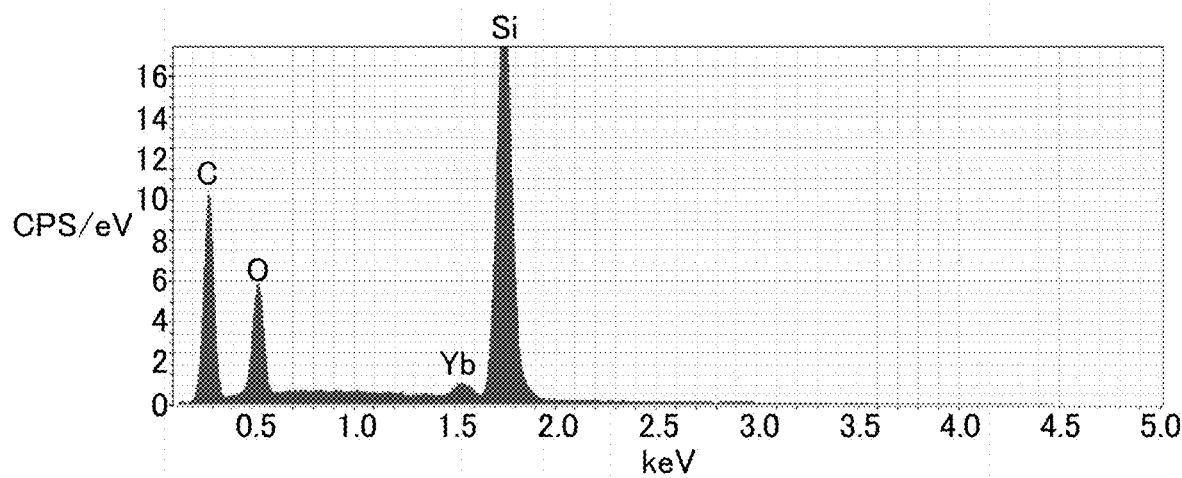
FIG. 14 is a graph showing an X-ray electronic spectroscopic spectrum measured at an area XIV in FIG. 9.
Figure 15:
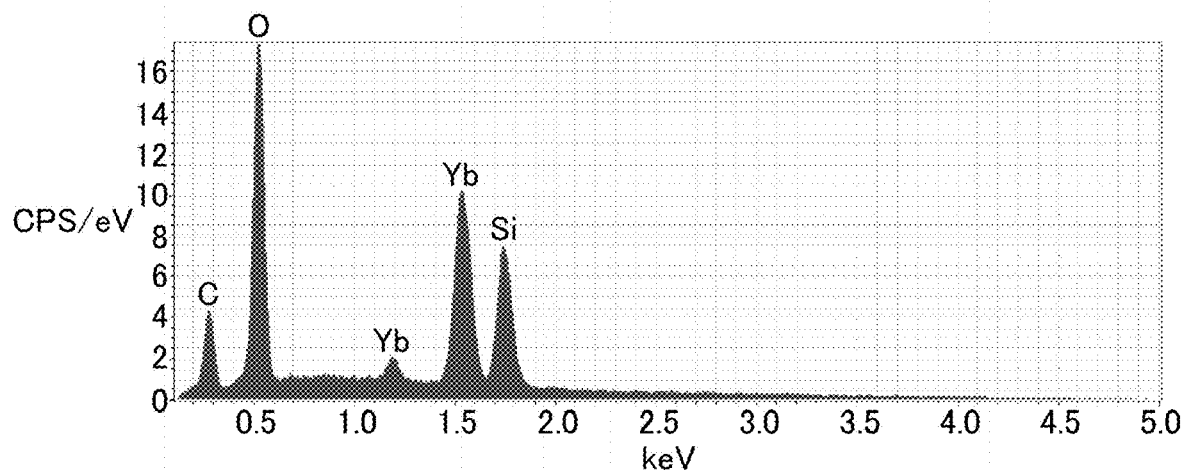
FIG. 15 is a graph showing an X-ray electronic spectroscopic spectrum measured at an area XV in FIG. 9.
Figure 16:
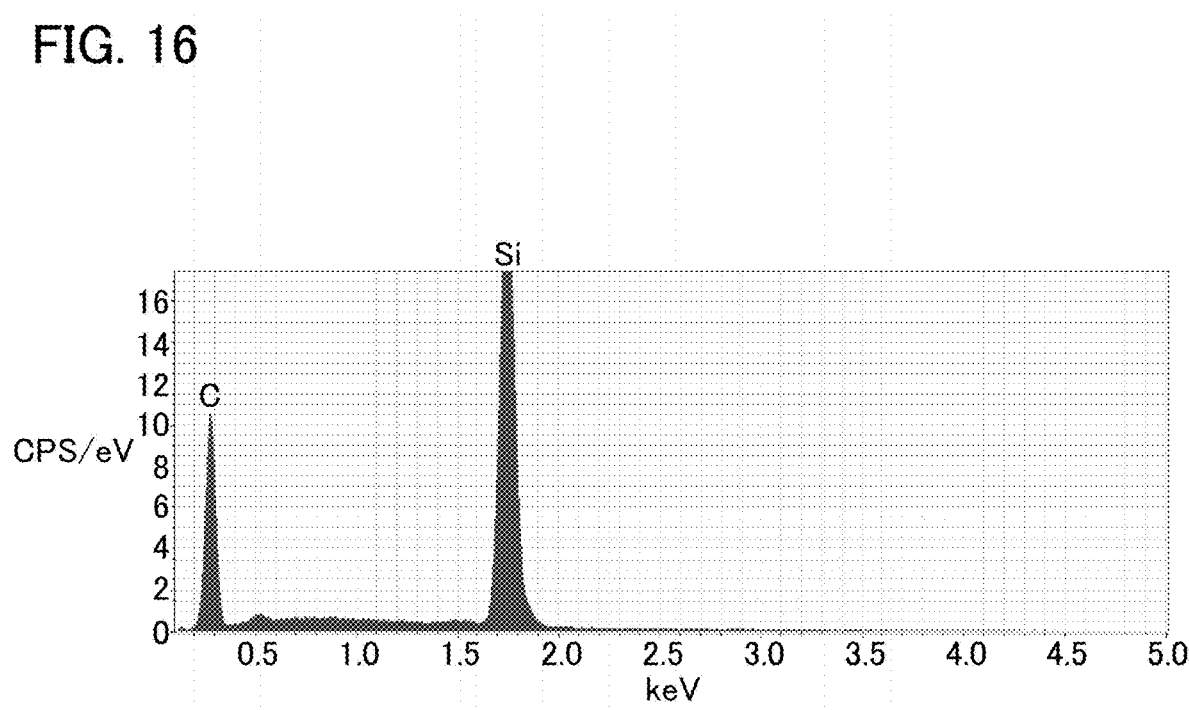
FIG. 16 is a graph showing an X-ray electronic spectroscopic spectrum measured at an area XVI in FIG. 9.

A spectrum by X-ray photoemission spectroscopy on an area XIII in the layer 25E is, as shown in FIG. 13, similar to that in FIG. 10 and thus contains carbon-, oxygen-, and silicon-derived peaks. Specifically, the layer 25E is considered to be the matrix. Measurement on the area XIV in the layer 23E reveals carbon-, oxygen- and silicon-derived peaks. A weak ytterbium-derived peak is considered to reflect a signal from an adjacent ytterbium silicate layer because the electron beam spreads over the test piece, and therefore it seems not to be oxidized. Measurement on the area XV in the layers 15E, 17E, as shown in FIG. 15, reveals carbon-, oxygen-, ytterbium- and silicon-derived peaks and therefore this layer is considered to be mainly of ytterbium silicate. A measurement result on the area XVI is, as shown in FIG. 16, similar to FIG. 12, and this area is therefore the reinforcement fiber 11E.

In sum, it is considered that the respective coatings in the working example could survive the oxidation tests by the superheated steam and therefore the working example is superior in oxidation resistance to the comparative example.

Although certain embodiments have been described above, modifications and variations of the embodiments described above will occur to those skilled in the art, in light of the above teachings.

INDUSTRIAL APPLICABILITY

A coated reinforcement fiber with water vapor oxidation resistance that prominently improves strength of fiber reinforced composites can be provided.

What is claimed is:
1. An environment-resistive coated reinforcement fiber applicable to a fiber reinforced composite, comprising:
   a reinforcement fiber;
   a coating layer covering the reinforcement fiber and including a rare-earth silicate;
   an exfoliative layer intervening in an interface between the coating layer and the reinforcement fiber and in direct contact with the reinforcement fiber; and a supplemental coating layer covering the reinforcement fiber, the exfoliative layer and the coating layer, wherein the exfoliative layer is formed by executing first heating on the reinforcement fiber under a first atmosphere including an organic rare-earth compound at a first temperature, the first temperature being 650° C., and wherein the coating layer is formed by executing second heating on the reinforcement fiber after being exposed to the first heating under a second atmosphere at a second temperature, the second temperature being higher than the first temperature and being 900° C.

2. The coated reinforcement fiber of claim 1, wherein the supplemental coating layer includes silicon carbide.

3. The coated reinforcement fiber of claim 1, wherein the exfoliative layer includes a rare-earth silicate.

4. The coated reinforcement fiber of claim 3, wherein the rare-earth silicate in the coating layer and the exfoliative layer is ytterbium silicate.

5. The coated reinforcement fiber of claim 1, wherein the reinforcement fiber includes silicon carbide.

6. The coated reinforcement fiber of claim 1, wherein the second atmosphere includes an organic rare-earth compound identical to the organic rare-earth compound in the first atmosphere.

7. The coated reinforcement fiber of claim 2, wherein the exfoliative layer includes a rare-earth silicate.

8. The coated reinforcement fiber of claim 7, wherein the rare-earth silicate in the coating layer and the exfoliative layer is ytterbium silicate.

\* \* \* \* \*